United States Patent
Vaman et al.

(10) Patent No.: US 8,867,645 B2
(45) Date of Patent: Oct. 21, 2014

(54) USE OF ORTHONORMAL TRANSFORMATION FOR IMPROVING PERFORMANCE OF DIGITAL TRANSMISSION UNDER HEAVILY FADED CHANNELS WITH DOPPLER EFFECTS

(71) Applicant: Digital Compression Technology, LLC, New York, NY (US)

(72) Inventors: Dhadesugoor Vaman, Frederick, MD (US); Siew T. Koav, Houston, TX (US)

(73) Assignee: Digital Compression Technology, LLC, New York, NY (US)

( * ) Notice: Subject to any disclaimer, the term of this patent is extended or adjusted under 35 U.S.C. 154(b) by 0 days.

(21) Appl. No.: 13/705,817

(22) Filed: Dec. 5, 2012

(65) Prior Publication Data
US 2014/0153660 A1    Jun. 5, 2014

(51) Int. Cl.
*H04L 23/02*    (2006.01)
*H04L 27/34*    (2006.01)

(52) U.S. Cl.
CPC .................................. *H04L 27/3405* (2013.01)
USPC ............................ 375/261; 375/262; 714/761

(58) Field of Classification Search
CPC ............ H04L 1/0057; H04L 25/03828; H04L 25/2626; H04L 25/2647; H04L 27/34; H04L 27/38; H04L 27/3405; H03M 13/152; H03M 13/2909
USPC .................................... 375/261, 262; 714/761
See application file for complete search history.

(56) References Cited

U.S. PATENT DOCUMENTS

| | | | |
|---|---|---|---|
| 4,928,288 | A | 5/1990 | D'Aria |
| 2003/0056167 | A1 | 3/2003 | Yuan et al. |
| 2009/0077448 | A1 | 3/2009 | Haas et al. |
| 2009/0228760 | A1 | 9/2009 | Vaman |
| 2011/0013714 | A1* | 1/2011 | Tamaki et al. ................ 375/285 |

OTHER PUBLICATIONS

Vaman, D., et al., "Design of Modular SDR Architecture for Resource Constrained Manet", Nov. 2010, pp. 1-13, SDR Forum Conference, Washington, DC, USA.
Vaman, D., et al, "A Simple and Least Complex KV Transform Coding Technique . . ." Oct. 11-14, 2009, pp. 335-342, Systems, Man and Cybernetics, IEEE Conference, Texas, USA.
Lu, J., et al. "M-PSK and M-QAM BER Computation Using Signal-Space Concepts", Feb. 1999, pp. 181-184, vol. 47, Issue 2, IEEE, US.
PCT International Search Report and Written Opinion, Jul. 1, 2014, pp. 1-8, Mail Stop PCT, U.S.

* cited by examiner

*Primary Examiner* — Leon Flores
(74) *Attorney, Agent, or Firm* — Keith D. Nowak; Carter Ledyard & Milburn LLP

(57) ABSTRACT

The proposed invention teaches basic principles of "orthonormal transform" to be used to convert a set of discrete samples into a set of coefficient real samples that is contained in a finite field. The number of real values in each coefficient samples is finite and coded for transmission using digital modulation. It also teaches that handling of multi-path fading of Doppler effects implies that the Bit Error Rate (BER) performance as a function of Bit Energy/Noise ($E_b/N_0$) is close to the performance of Additive White Gaussian Noise (AWGN) channel. The effect of impairments is minimized and only the effect of thermal noise (AWGN) is maintained.
The inventive apparatus is simple and maintains constant end-to-end response time, sustainable effective data rate and bounded error performance which is conducive to specify a Quality of Service (QoS) which is useful for service provisioning.

3 Claims, 13 Drawing Sheets

USE OF ORTHONORMAL TRANSFORMATION FOR IMPROVING PERFORMANCE OF DIGITAL TRANSMISSION UNDER HEAVILY FADED CHANNELS WITH DOPPLER EFFECTS

This invention was made with government support under W911NF-04-2-0054 awarded by the Army Research Laboratory. The government has certain rights in this invention.

FIELD OF THE INVENTION

The present invention relates to method and apparatus for improving the performance over wireless channel using any modulation and protocol when multi-path fading and Doppler effects are present. Therefore, the proposed invention can benefit all IEEE 802.X wireless LANs and Backhaul Line of Sight Wireless networks and Cellular (3G and 4G) networks.

BACKGROUND OF THE INVENTION

Simple orthogonal transforms such as the Haar transform have been used in image recovery, but communications channels tend to use techniques such as the Hadamard transform for forward error corrections. The complexity of transformation for forward error correction often requires complex adaptive and dynamic quantization techniques and increased processing times. For example, a Haar transform takes a set of discrete samples and transforms the samples into a set of real value samples in an infinite field. Even though the transform is invertible, transmitting real value samples in a digital communications channel requires a dynamically adaptive quantizer which increases processing complexity. On the other hand, if the real value samples are modified to contain only a set of finite values and create a finite field set, they are not invertible exactly and therefore will have errors in reconstruction. From a digital transmission point of view, the transformation must be invertible to recover data and allow the samples to be in a finite field to ensure that they can be transmitted using any digital modulation technique. Therefore, a Haar transform, while used in video compression techniques, has not be used in error corrections due to impairments in a digital communications channel.

Also, Wireless channels which have multi-path fading impairments and Doppler effects often make it difficult to use complex modulations. They also tend to be bandwidth limited and mobility of the nodes affect maintaining continuous path connectivity and thus causes significant performance degradations.

The proposed invention is based on a unified newly developed Koay-Vaman (KV) transform that uses "orthonormal transformation" which is easily invertible. It takes a discrete sample set and transforms it into real value samples that are contained in a finite field. Therefore, the real value samples can be coded using any digital modulation technique whereby the invertible transform property is combined with the values of each output sample in the "finite field". This allows use of the transform for error recovery in the physical layer of the network as a form of "Forward Error Correction". Also, the error correction can be done selectively in a finite amount of time which is critical to maintain end-to-end delay to a minimum value. This is superior to existing error correction techniques such as Automatic Repeat Request (ARQ) used at the link layer where packet retransmission can cause errors in the transmission as part of error correction and cause further delay to become random and extensive. It is also less complex and cumbersome compared to more common error correction techniques used today including "Hadamard transform" and "Reed-Solomon Coding" and "turbo-coding".

The performance of the proposed invention is demonstrated when using Quadrature Amplitude Modulation as the digital modulation over the channel. It achieves minimization of the impact of multi-path interference (fading) and Doppler effects in the wireless channel. The performance of the overall system in the presence of multi-path fading and Doppler effects plus AWGN is compared to that of the presence of AWGN only.

SUMMARY OF THE INVENTION

The use of coefficient sample interleaving coupled with the error correction using the KV Transform improves the performance under heavy multi-path fading and Doppler effects. For demonstrating the performance improvement, Rayleigh Fading model in an AWGN channel is chosen where both phase and amplitudes are impacted by the noise. While interleaving of samples is employed at the sending side, the receiving side is designed with phase equalization to handle phase jitters due to Doppler effects. The combined sample error correction, coefficient sample interleaving and phase equalization allows the system to achieve significant improvement in robustness. While, the system achieves Data Error Rate of less than $10^{-7}$ at Eb/N0 of 10 dB (16 QAM) and 15.5 dB (64 QAM) for AWGN channel, it also achieves similar results when using interleaving and a receiver equalizer for fading channel and Doppler effects at Eb/N0 of less than 12 dB (16 QAM) and 16.5 dB (64 QAM).

Multipath impairments with Doppler effects have been studied for a number of years in wireless communications and solutions have been found by using bit interleaving and phase equalizations. These techniques tend to be reasonable for outdoor wireless channels, but are not suitable for indoor channels and indoor-outdoor channels that tend to occur in homeland theaters and battlefield communications. Also, the data errors are generally corrected in the link layer using Automatic Repeat Request (ARQ) procedures. This causes increased end-to-end random delays which are not conducive to deliver QoS to applications. Also, the overhead bandwidth increases randomly and reduces the resource efficiency. Other Forward Error Correction techniques (FEC) such as Reed-Solomon and Turbo coding also increases the processing times both in the transmitter and the receiver.

Historically, the Haar transform uses discrete samples as the input to an "orthogonal transformation" that produces coefficient samples with real values in infinite space. The transform is invertible and therefore the reconstruction of discrete samples is possible through inverse orthogonal transform of the coefficient sample. However to transmit real values in infinite space over a digital channel is not easy unless some form of dynamic and adaptive quantizer is used which increases processing complexity. Also, if any modification is made to make the real value samples contained in a finite space the Haar transform may not be suitable for coding and transmission over a digital modulated channel. However, in both cases, the invertibility to recover the discrete samples exactly is lost. Thus, the recovery of the original discrete samples can be in error. As such, while this technique is more commonly applicable as a wavelet compression technique suitable in video applications, it is not suitable for error handling in a digital communication system. In contrast, the KV transform method and apparatus uses discrete samples as the input to an "ortho-normal transformation" that produces coefficient samples with real values in finite space. These real values can be coded digitally and transmitted over a digital modulated channel. At the receiving side, the coded samples can be converted to real value samples and perform the inverse "ortho-normal transformation to recover the discrete samples and thereby data in its exact form. The proposed invention is readily suitable for error correction to handle multi-path fading and Doppler effects.

The KV transform method and apparatus takes a non-classical approach in its design to capitalize on the uniquely distinctive symmetric structure of the overhead samples, d1 and d2 synergistically in tandem with the desired ortho-normal feature of the transform in order to efficiently and reliably detect and correct errors while at the same time making sure it meets other logistic requirements such as handling multi-hop connectivity in wireless networks with the impact of multi-path fading and Doppler effects.

In general, the use of FEC must be such that the delays associated with the processing of errors, the end-to-end response times and resource efficiency must be bounded. The proposed KV transform coding technique teaches that the end-to-end delay is constant and maintains resource efficiency and handles mobility of the nodes while minimizing the impact of multi-path fading and Doppler effects such that the BER versus Eb/N0 performance reaches close to that of a AWGN channel. Thus, the initial method and apparatus described herein has enormous potential in wireless digital communications channels. In these environments, the proposed invention allows the wireless networks to provide end-to-end service provisioning without minimal or any disruption even when multi-path impairments occur on the channels along with Doppler effects.

The proposed invention has been tested using M-ary Quadrature Amplitude Modulation (QAM). The overall communication path requires modeling of both "system and channel modeling". The system modeling requires consideration to handle multi-path flat fading and slow Doppler effects indoors. Multi-path flat fading is typically modeled using a Rayleigh fading model. In order to consider application of this model, the channel needs to be modeled where QAM is used as the modulation for transmitting the data. The present invention presents a novel scheme of using integrated coding and QAM modulation for handling indoor multi-path fading and Doppler effects which enables recovery of data at low Bit Error Rate (BER) when operating at very low Eb/N0. Other types of modulations can also be used and the invention described herein does not preclude other types of modulations.

There are several components that are integrated to ensure that reliable data recovery is achieved at the receiving side:

KV Transform Coding based on Invertible Ortho-normal transformation which transforms four discrete samples into four coefficient samples with finite set real values. Because each coefficient sample has a finite set of real values, it can be coded digitally with a finite set to create a QAM constellation. The number of discrete samples converted into coefficient samples can be anything from minimum four to large numbers.

The Interleaving of digitally coded constellations from a group of KV blocks each of which produces four discrete coefficient samples from four discrete input samples. Additionally each KV block creates two error correcting samples to exactly correct one out of four discrete coefficient samples received at the receiver.

The errors are detected and corrected for each KV block at the receiving side such that one out of four coefficient samples are corrected exactly, prior to recovering the discrete samples and corresponding digital data.

The remaining KV blocks in error are allowed to be retransmitted once in the next ensemble time for further improvement of performance.

Phase equalization is deployed at the receiver to handle the Doppler effects.

This use of an integrated KV/QAM system with sample inter-leaving and phase equalization allows transmitted data to be recovered at very low $E_b/N_0$. The result show that the BER versus $E_b/N_0$ for Rayleigh fading channels with Doppler effects of the integrated KV/QAM system approaches the performance achieved for an Additive White Gaussian Noise (AWGN) channel.

DETAILED DESCRIPTION

Figure 1:
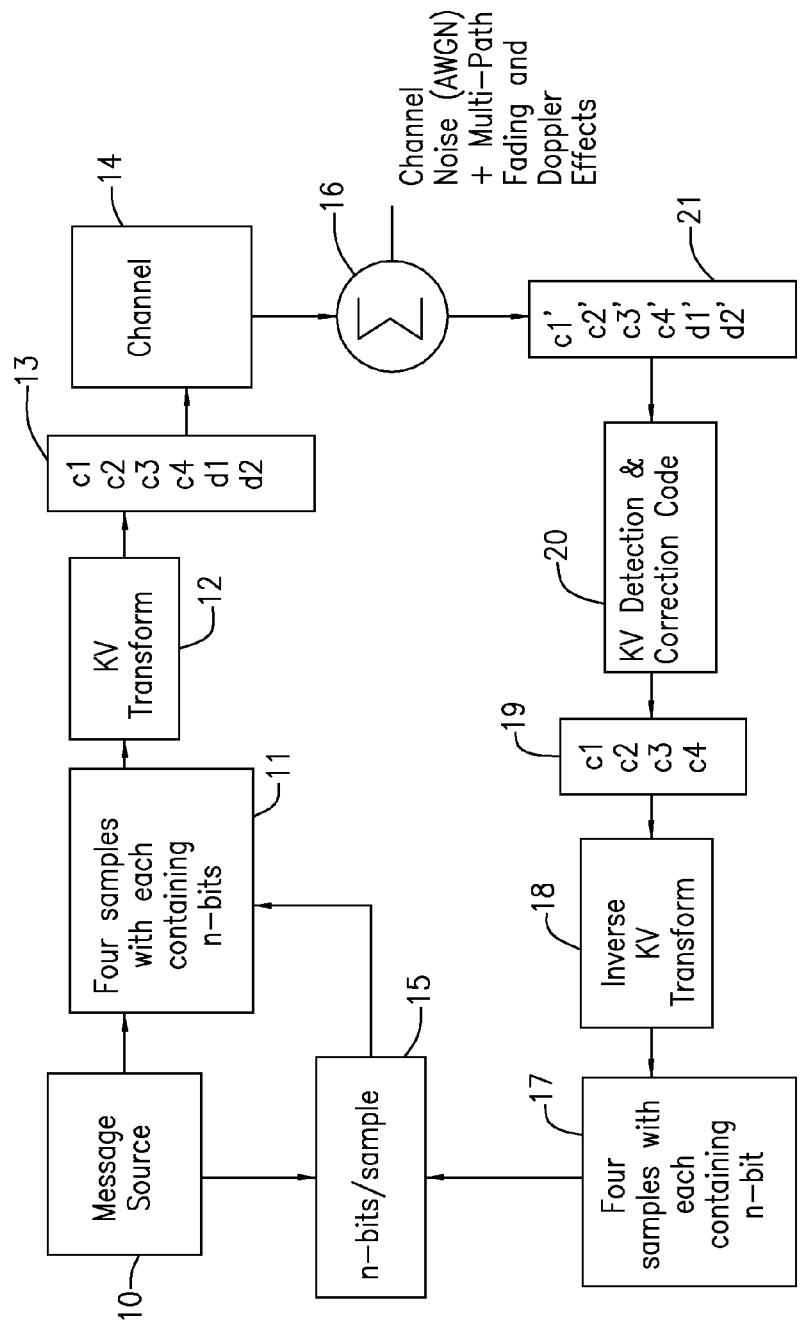
FIG. 1 illustrates a block diagram of apparatus in accordance with the present invention.

Embedded transform coding techniques can be classified as FEC techniques with the exception that they are based on transform techniques where user data is transformed and sent to the receiving side. The transformation allows for error correction with some side information. These techniques have been used extensively in image processing applications.

Haar and Hadamard Transforms are some of the techniques that are commonly used in video compression techniques. Reed-Solomon code and Turbo Codes are used in digital communications and tend to have large overhead for error correction and occupy greater channel bandwidth (>30%) for error improvement in AWGN channels. The effect of random response time and channel overhead tend to decrease the ability of these techniques to offer sustainable Quality of Service (QoS) for end user applications.

The Haar transform has been used in image processing application but not in communications applications. The complexity of transformation for forward error correction often requires complex adaptive and dynamic quantization techniques and increased processing times. For example, the Haar transform takes a set of discrete samples and uses an orthogonal transformation to generate a set of samples with infinite real values and therefore the values are represented in an infinite field. Even though, the transform is invertible, transmitting real value samples in a digital communications channel requires a dynamically adaptive quantizer which increases processing complexity. On the other hand, if the real value samples are modified to contain only a set of finite values and create a finite field set, they are not invertible exactly and therefore will have induced more errors in reconstruction of data. From a digital transmission point of view, the transformation must be invertible to recover data and allow the samples to be in a finite field to ensure that they can be transmitted using any digital modulation technique. Therefore, a Haar transform, while used in video compression techniques, has not been used in error corrections due to impairments in a digital communications channel.

Wireless channels have strict bandwidth constraints and limited processing time to handle the mobility of nodes and such complex transform techniques cannot deliver end-to-end QoS. The proposed inventive method and apparatus (KV transform) allows simplicity over the optimal technique and adapts to the wireless channels by offering strict performance of bounded constant delay and therefore allows for error correction that is used along with interleaving and phase compensation to ensure handling of multi-path fading and Doppler effects with simple orthonormal transform that is invertible. This technique has been tested with a QAM channel and it shows that the BER vs Eb/N0 performance reaches close to that of AWGN channel and therefore minimizes the effects of fading and Doppler.

The proposed invention is based on using ortho-normal transformation of four discrete value samples to four coefficient samples with a finite set of real values that can be represented by a set of distinct digital codes for use over a digital channel. At the receiver, the received coded coefficient samples can be used to reconstruct finite set real values for each coefficient sample and then perform the inverse ortho-normal transform to recover the discrete samples from where the data is extracted.

The uniqueness of ortho-normal transformation is the invertibility of the transform and maintaining a finite field set of real values of the coefficient samples. This will allow the use of any digital modulation scheme for communication.

In addition to the ortho-normal transformation, the proposed invention integrates error correction of one out of four coefficient samples exactly and performs interleaving of coded coefficient samples from a set of KV blocks to handle multi-path fading environment and Doppler effects. Moreover, the receiver circuit has a phase equalization to handle Doppler effects. The error correction process is a two-step process:

The first step is to send coefficient samples and additional two overhead samples to correct one out of four coefficient samples in error. Since the KV transform has a unique property of not only detecting the presence of errors and correcting the sample error; it also has the ability to know the location and the remaining KV blocks in error.

The second step is to ask for a retransmission of remaining KV blocks in error. When more than one sample out of four are in error, then the KV block is declared to have an error. Since the remaining KV blocks in error are known with its location, the proposed invention uses "one and only one" retransmission of the remaining KV blocks in error. This adds one extra ensemble delay in the performance, but gains to correct most of the errors and therefore, the effective BER versus Eb/N0 performance is significantly increased.

The interleaving and phase equalization are required to reduce the impairments due to multi-path fading and Doppler effects.

The digital data that needs to be transmitted over a digital communications channel is used in sets of n bits to create discrete analog samples. A block of four discrete analog samples are represented as follows:

$$\underline{B} = [b_{i1}, b_{i2}, b_{i3}, b_{i4}] \quad (1)$$

$[b_{i1}, b_{i2}, b_{i3}, b_{i4}]$ represents the four discrete samples used as input to KV Block i.

The serial digital data from a given source goes to a serial-parallel circuit for transmission using a block of KV transform coders. Each KV block will have n bits transmitted by creating four discrete samples as inputs. The value n can be anything depending on the type of the modulator being used. When n=4, the total number of discrete values in a sample is 16. The corresponding coefficient sample after the transformation will have 16 possible real values. Similarly, when n=5, the number of real values in each coefficient sample and the input discrete sample is 32.

The proposed invention also can change the value of n dynamically based on the channel condition for each ensemble. The channel condition can be described based on the index factor of number of remaining KV blocks in error over the total number of KV blocks transmitted in an ensemble. This number can vary from 0 to 1, where 0 means that there are no KV blocks are in error. The value 1 implies that all KV blocks are in error in the ensemble. For a typical multi-path fading channel, this value can range around 0.3-0.7. It is possible to index the value of n to be 5 for a range of values between 0 and 0.3 (channel index), n to be 4 for the range of values between 0.3-0.6 and n to be 3 for the range of values above 0.6.

The vector $\underline{B}$ is used as the input to an "ortho-normal basis matrix (M)" which is transformed to produce four coefficient samples. The following 4-square orthonormal matrix M converts these 4 discrete samples to 4 coefficient samples ("C"), by simply performing the inner product of matrix b and M as follows:

$$\underline{C}_{ij} = \underline{M} * \underline{b}^T \quad (2)$$

$$[c_{i1} \quad c_{i2} \quad c_{i3} \quad c_{i4}] = \begin{bmatrix} \frac{1}{\sqrt{2}} & \frac{1}{\sqrt{2}} & 0 & 0 \\ 0 & 0 & \frac{1}{\sqrt{2}} & \frac{1}{\sqrt{2}} \\ \frac{1}{\sqrt{2}} & -\frac{1}{\sqrt{2}} & 0 & 0 \\ 0 & 0 & \frac{1}{\sqrt{2}} & -\frac{1}{\sqrt{2}} \end{bmatrix} \cdot [b_{i1} \quad b_{i2} \quad b_{i3} \quad b_{i4}]^T$$

Where, $C_{ij}$ is the jth coefficient sample of the ith KV block and $b_{ij}$ is the jth discrete input sample of the ith KV block.

The coefficient samples vector, $\underline{C}_{ij}$ of a set of KV blocks are transmitted over the digital communications channel to the receiving side, where the discrete samples of each KV block is recovered after error correction and the data is extracted.

This transformation is at the sending side and the $\underline{C}_{ij}$ transmitted over the communications channel. At the receiving side, there is an inversion operation to recover the vector $\underline{b}_{ij}$ as follows: The inverse transformation after error correction is given below:

$$\underline{b} = \underline{c} \cdot \underline{M} \quad (3)$$

$$[b_{11} \ b_{12} \ b_{13} \ b_{14}] =$$

$$[c_{11} \ c_{12} \ c_{13} \ c_{14}] \cdot \begin{bmatrix} \frac{1}{\sqrt{2}} & \frac{1}{\sqrt{2}} & 0 & 0 \\ 0 & 0 & \frac{1}{\sqrt{2}} & \frac{1}{\sqrt{2}} \\ \frac{1}{\sqrt{2}} & -\frac{1}{\sqrt{2}} & 0 & 0 \\ 0 & 0 & \frac{1}{\sqrt{2}} & -\frac{1}{\sqrt{2}} \end{bmatrix}$$

For error correction, there is a need to send additional information. The additional information is created from the matrix as follows:

Two additional overhead samples, $d_{i1}$ and $d_{i2}$ are created using the following equations:

$$d_{i1} = 0.5C_{11} - 0.5C_{12} + 0.7071C_{13} - 0.7071C_{14}$$

$$d_{i2} = 0.5C_{11} + 0.5C_{12} - 0.7071C_{13} - 0.7071C_{14}$$

These are the two additional overhead samples for the ith KV block.

These two equations are pivotal to detect and correct one out of four coefficients in error in the received coefficient samples, c. The error mitigation occurs due to AWGN channel and multi-path fading & Doppler impairments.

Referring now to the Figures, FIG. 1 illustrates the block schematic diagram of the communications system using the KV transform coding technique as implemented using four n-bit samples. It shows a step-by-step process beginning with the generation of bits from the message source (10) and group them into 4 bits to create discrete analog samples (11 and 15). Four discrete analog samples are transformed into 4 coefficient samples by the real 4-square orthonormal matrix M (12). These 4 coefficients samples, along with 2 additional coefficient samples $d_1$ and $d_2$ (13), are transmitted through the channel (14) to the receiver (21). The two additional coefficient samples d1 and d2 are generated during the KV coding step at 12. During the transmission, these 6 coefficients can possibly be corrupted by AWGN noise and also impaired by multi-path fading and Doppler effects (16) due to the wireless communications and mobility of the devices. The KV transform (20) is expected to correct one sample out of four samples exactly due to the invertible ortho-normal transform. A set of error correction policies is used to correct one out of four orthogonal samples exactly (19). Then the inverse KV transform (18) produces estimated discrete samples from the corrected orthogonal samples by minimizing the errors in the recovery of samples and then they are decoded to produce the estimated digital data (17).

When more than one coefficient sample is received in error, the errors cannot be corrected and we determine that the samples are in error and the system can use retransmission of the samples in error to be retransmitted if necessary. This is a system design function.

Let $C_{11}$, $C_{12}$, $C_{13}$, $C_{14}$, $D_{11}$, $D_{12}$ represent the received coefficient samples at the input to the receiver, whereas $C_{11}$, $C_{12}$, $C_{13}$, $C_{14}$, $d_{11}$, $d_{12}$ represent the transmitted coefficient samples at the input of the channel. The coefficients $C_{11}$, $C_{12}$, $C_{13}$, $C_{14}$ are related to $D_{11}$, $D_{12}$ through the following equations:

$$D_1 = 0.5C_{11} - 0.5C_{12} + 0.7071C_{13} - 0.7071C_{14} \quad (4)$$

$$D_2 = 0.50C_{11} + 0.5C_{12} - 0.7071C_{13} - 0.7071C_{14} \quad (5)$$

These two equations, which express $D_1$ and $D_2$ as linear combination of $C_{11}$, $C_{12}$, $C_{13}$, $C_{14}$, provide us with the necessary means to detect and correct the errors. We assume that at most one error in each of the 6 coefficients can occur during each transmission.

We consider using for a single KV block that is represented by the received Coefficient samples C1, C2, C3 and C4 instead of C11, C12, C13 and C14 that represents the first KV block coefficient samples.

Similarly, we consider using the overhead samples as D1 and D2 instead D11 and D12.

Let e1 and e2 represent the difference between the transmitted coefficient samples $d_1$, $d_2$ and received coefficient samples $D_1$, $D_2$ respectively as follows:

$$\begin{aligned} e1 = D1 - d1 &= \\ &= 0.5(C_{11} - c_{11}) - 0.5(C_{12} - c_{12}) + \\ &\quad 0.7071(C_{13} - c_{13}) - 0.7071(C_{14} - c_{14}) \\ &= 0.5\Delta_{11} - 0.5\Delta_{12} + 0.7071\Delta_{13} - 0.7071\Delta_{14} \end{aligned} \quad (6)$$

$$\begin{aligned} e2 = D2 - d2 &= \\ &= 0.5(C_{11} - c_{11}) + 0.5(C_{12} - c_{12}) - \\ &\quad 0.7071(C_{13} - c_{13}) - 0.7071(C_{14} - c_{14}) \\ &= 0.5\Delta_{11} + 0.5\Delta_{12} - 0.7071\Delta_{13} - 0.7071\Delta_{14} \end{aligned} \quad (7)$$

Where, $\Delta_{1i}$, i=1, 2, 3, 4 denote the change in value of the coefficient samples $C_{11}$, $C_{12}$, $C_{13}$, $C_{14}$. We should notice that values of e1 and e2 are multiples of 0.5 should $C_{11}$ or $C_{14}$ be in error and multiples of 0.7071 should $C_{12}$ or $C_{13}$ be in error. Also, we should notice that e1 and e2 are equal to one another should $C_{11}$ or $C_{14}$ be in error and e1 and e2 are equal in value but opposite in sign should $C_{12}$ or $C_{13}$ be in error. These observations allow the system to develop the following policies for error correction:

The error handling is done using a sequential approach using the following steps:

Case 0: No error occurs in any one of the coefficients, when $$e1 = e2 = 0 \quad (8)$$

If this case is true, then the KV block is declared as having no errors and all samples are correctly received. If it is not true, then we test the conditions for Case 1, Case 2 and Case 3 in parallel:

Case 1: Error occurs in d1, when $$e1 \neq 0 \text{ and } e2 = 0 \quad (9)$$

$$\begin{aligned} e1 &= 0.5\Delta_{11} - 0.5\Delta_{12} + 0.7071\Delta_{13} - 0.7071\Delta_{14} \\ &= D_1 - d_1 \neq 0 \end{aligned} \quad (10)$$

$$\begin{aligned} e2 &= 0.5\Delta_{11} + 0.5\Delta_{12} - 0.7071\Delta_{13} - 0.7071\Delta_{14} \\ &= D_2 - d_2 = 0 \end{aligned} \quad (11)$$

Since we assume that at most one error can occur in the coefficients and since e1 or e2 is a linear combination of $C_{11}$, $C_{12}$, $C_{13}$, and $C_{14}$, e2=0 indicates that there is no error in any one of the four c coefficients and e1≠0 clearly indicates that the error occurs in d1.

Detection: $e1 \neq 0$ and $e2 = 0$ \quad (12)

Correction: $d1 = d1 + e1$ \quad (13)

Case 2: Error occurs in d2, when $$e2 \neq 0 \text{ and } e1 = 0 \quad (14)$$

$$e1 = 0.5\Delta_{11} - 0.5\Delta_{12} + 0.7071\Delta_{13} - 0.7071\Delta_{14} \quad (15)$$
$$= D_1 - d_1 \neq 0$$

$$e2 = 0.5\Delta_{11} + 0.5\Delta_{12} - 0.7071\Delta_{13} - 0.7071\Delta_{14} \quad (16)$$
$$= D_2 - d_2 \neq 0$$

By the same argument as in case 1, $e2 \neq 0$ and $e1=0$ indicates that the error occurs in d2.

$$\text{Detection:} e2 \neq 0 \text{ and } e1=0 \quad (17)$$

$$\text{Correction:} d2=d2+e2 \quad (18)$$

Case 3: Error occurs in $C_{11}$ or $C_{14}$ when both e1 and e2≠0

$$e1=0.5\Delta_{11}-0.5\Delta_{12}+0.7071\Delta_{13}-0.7071\Delta_{14} \quad (19)$$

$$e2=0.5\Delta_{11}+0.5\Delta_{12}-0.7071\Delta_{13}-0.7071\Delta_{14} \quad (20)$$

We notice from the above two equations that when e1=e2 and both are ≠0, the error is either in $C_{11}$ or $C_{14}$ but not both since we assume at most one error can occur at a time and also the coefficient of $\Delta_{11}$ in e1 and e2 and the coefficient of $\Delta_{14}$ in e1 and e2 are the same in value and sign. We also notice that the coefficients of $\Delta_{11}$ and $\Delta_{14}$ are different in value that give us indication to pinpoint the source of error either from $C_{11}$ or $C_{14}$ and from which one.

$$\text{Detection:} e1=e2 \text{ and both are} \neq 0 \quad (21)$$

$$\text{Correction:} C_{11}=C_{11}-2e1$$

$$C_{14}=C_{14}+\sqrt{2}e1 \quad (22)$$

Case 4: Error occurs in $C_{12}$ or $C_{13}$ as indicated by e1=−e2 and both are ≠0

$$e1=0.5\Delta_{11}-0.5\Delta_{12}+0.7071\Delta_{13}-0.7071\Delta_{14} \quad (23)$$

$$e2=0.5\Delta_{11}+0.5\Delta_{12}-0.7071\Delta_{13}-0.7071\Delta_{14} \quad (24)$$

We notice from the above two equations that when e1=−e2 and both are ≠0, the error is either in $C_{12}$ or $C_{13}$ but not both since we assume at most one error can occur at a time and also the coefficient of $\Delta_{12}$ in e1 and e2 and the coefficient of $\Delta_{13}$ in e1 and e2 are the same in value but different in sign. We also notice that the coefficients of $\Delta_{12}$ and $\Delta_{13}$ are different that gives us an indication to pinpoint the source of the error either from $C_{12}$ or $C_{13}$.

$$\text{Detection:} e1=-e2\neq 0 \quad (25)$$

$$\text{Correction:} C_{12}=C_{12}+2e1$$

$$C_{13}=C_{13}-\sqrt{2}e1 \quad (26)$$

This section teaches the actual implementation of the communications system at the transmit side and at the receive side. For interleaving, coefficient samples from a set of KV transform coders are interleaved such that the effect of fading impairment is minimized by spreading the samples of each KV block by interleaving the samples of all the blocks; and the effect of Doppler is minimized by phase equalization at the receiving side. In addition, correcting one our four samples and selected retransmission of the remaining KV block in errors (not corrected) will improve the BER versus Eb/N0 performance significantly. This proposed invention teaches that the performance of the system in the presence of AWGN noise, multi-path fading and Doppler effects comes close to that of the performance considering only AWGN noise indicates that the system effectively minimized the impact of multi-path fading and Doppler effects. Thus, any digital modulation will operate effectively in any multi-path fading and Doppler environment effectively and maintain a sustainable Quality of Service which is suitable to a wide variety of multi-service applications.

Figure 2:
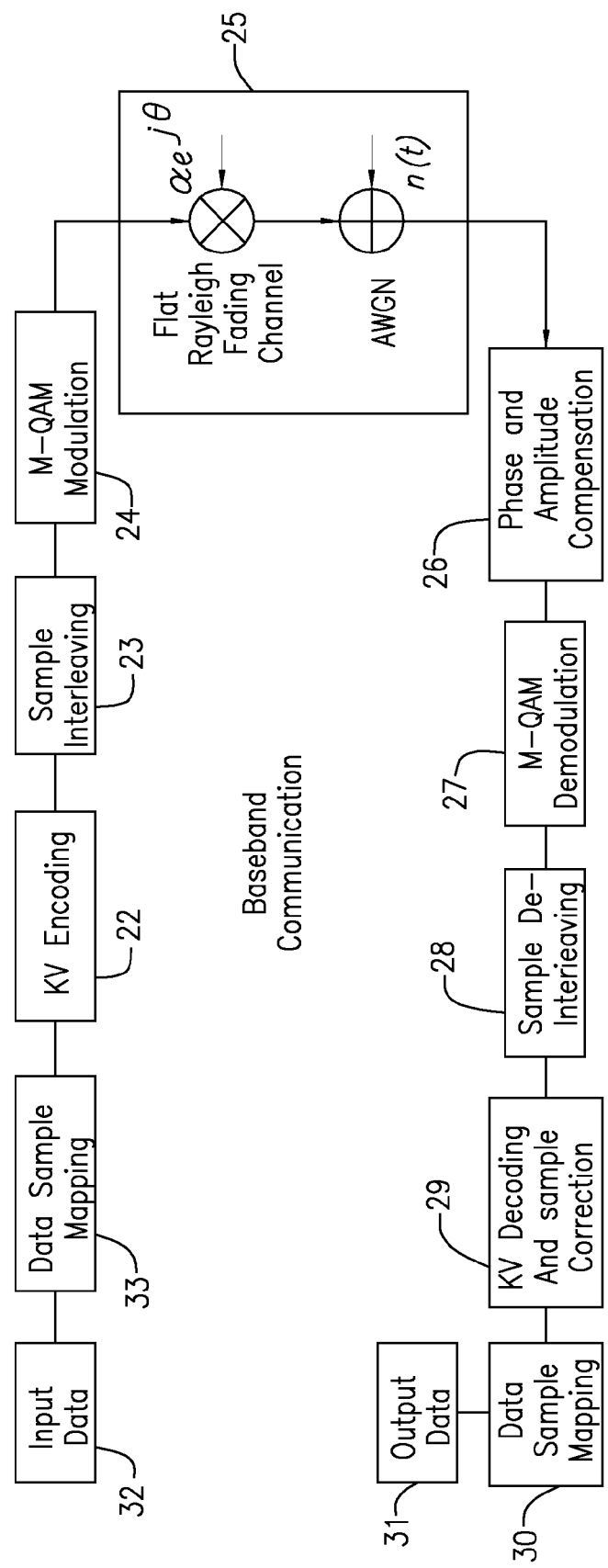
FIG. 2 illustrates a basic block diagram of a communications channel model of the present invention.

FIG. 2 illustrate a basic block diagram of a communications system for wireless network where the baseband communication (PHY Layer) uses M-ary QAM (M-QAM) modulation technique. The input data (32) at the sending side is converted into four discrete samples (n bits/sample where n can be anywhere from 2 bits to 5 bits) (33). The value of n is not important for demonstrating the KV encoding and decoding. The four discrete samples are used as the input samples and have been referred to as vector B. The KV encoding (22) which is based on the orth-normal transform produces four coefficient samples with finite real values. The samples are interleaved at 23. Each finite real value is coded as a discrete constellation as part of M-QAM (24). The AWGN channel (25) experiences fading and Doppler effects. Phase and amplitude compensation access at 26 with demodulation at 27 and de-interleaving at 28. Decoding and sample correction occurs at 29 and the data samples are mapped at 30. The error corrected output data is then available at 31.

We have considered a slow flat Rayleigh fading plus AWGN (Additive White Gaussian Nose) channel, so that the channel can be recognized to be constant for each symbol duration. This represents a typical indoor fading. The outdoor or free space fading is much more easy to handle and the same system handles outdoor fading much more gracefully. The mathematical expression of the signal received at the receiver is known and is generally written as described in J. Proakis and M. Salehi, "Digital Communications", 5th. ed., McGraw-Hill, 2008.

Figure 3:
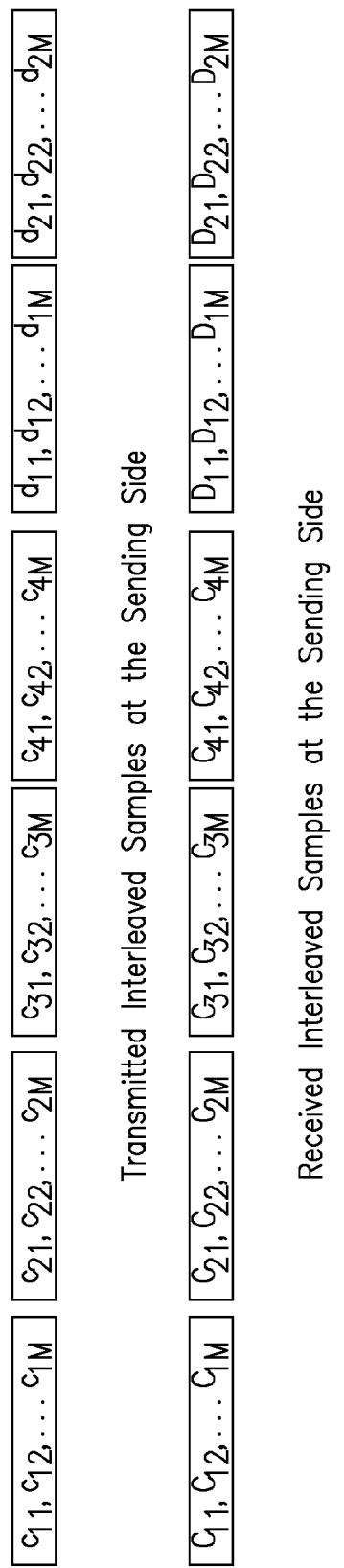
FIG. 3 illustrates the inventive sample interleaving technique.

FIG. 3 illustrates the Interleaving method. The sample interleaving is achieved by using a set of KV encoders such that the first coefficient sample (which is digitally coded) of each of the KV blocks is sent in a frame, the second of each of the KV blocks is sent in a second frame and so on. In addition, the KV encoding generates two side information samples d1 and d2 which has been described earlier and they are used for exact correcting one out of four coefficient samples at the receiving side. This proposed invention allows all variations of interleaving of samples and we have chosen one example for demonstrating the minimization of the impact of multi-path fading and Doppler effects.

Each Block of KV takes four discrete analog samples; b1, b2, b3 and b4 and produces four coefficient samples, c1, c2, c3 and c4 and two overhead samples, d1, d2. We represent cij as the ith coefficient sample of the jth KV block transmitted. The received coefficient samples are represented as Cij as the ith coefficient sample received corresponding to jth KV block. Similarly, the dij as the ith overhead of jth KV block transmitted and correspondingly Dij as the ith overhead of jth KV block received.

Indoor radio communication covers a wide variety of situations ranging from homeland security disaster environment to communication with individuals walking in residential or office buildings, etc., to fixed stations sending/receiving messages to moving robots. Due to reflection, refraction and scattering of the transmitted radio waves by walls, other obstacles, or moving persons, the transmitted signals arrive at the receiver via multiple paths. Consequently, the received replicas of transmitted signal superimpose constructively and destructively, resulting in multipath fading. The indoor multipath propagation channel can be characterized as a slow time varying channel with a delay spread up to 200 ns and RMS values up to 50 ns, and the attenuation varies over a 60 dB dynamic range. It also can create burst errors and it is a serious issue for indoor communications.

The modeling of multi-path is based on a slow flat Rayleigh fading plus AWGN so that the channel can be recognized to be constant over the symbol duration. The mathematical expression of the signal that is impaired by the multi-path fading can be written as:

$$y(t) = \alpha e^{-j\phi} s(t) + n(t) \quad 0 \leq t \leq T \tag{27}$$

Where, $\alpha$=Random Variable that represents amplitude variation of the signal along the propagated channel $\phi$ is the phase variation imposed by the channel $n(t)$ is the AWGN with zero mean with double sided spectral density of $N_0/2$ T is the symbol duration.

Figure 9:
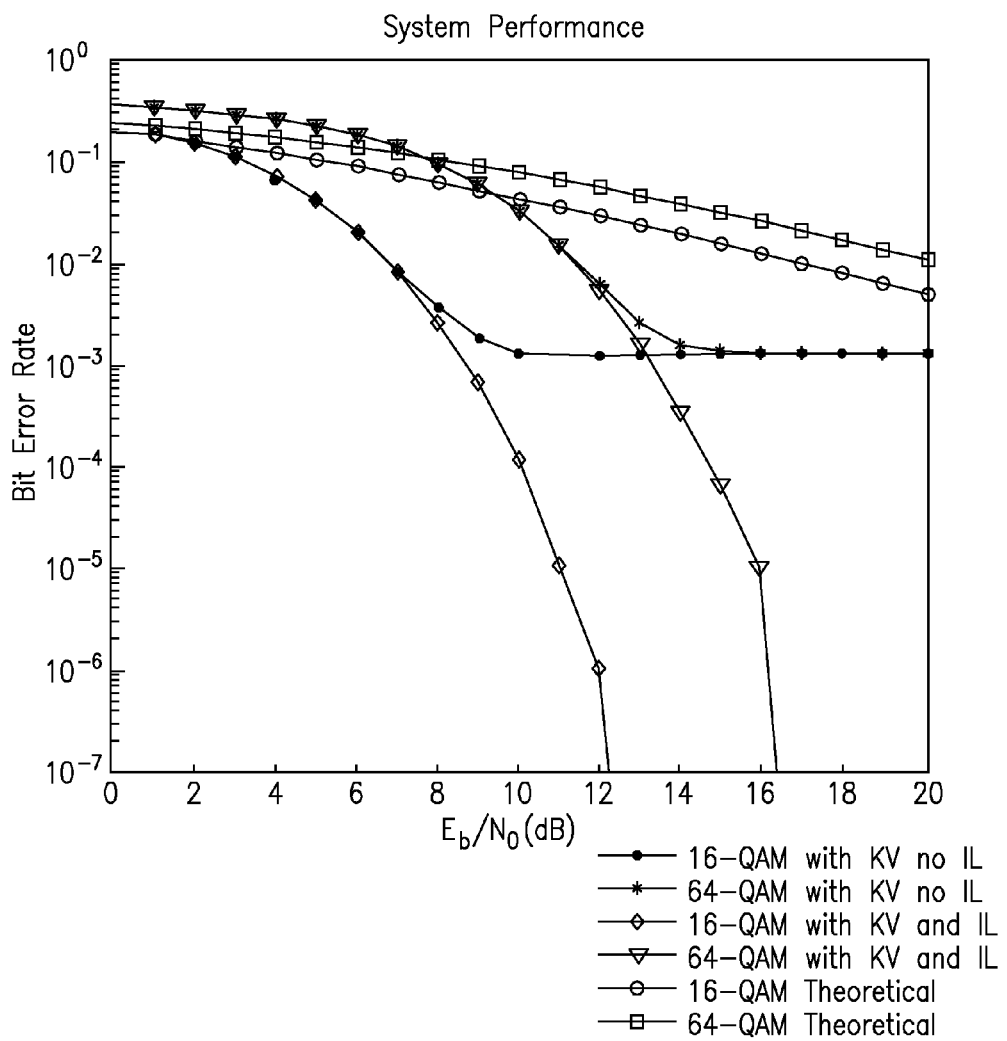
FIG. 9 illustrates the system performance of the inventive system and method.

FIG. 9 illustrates an example of the amplitude and phase variation of a scatter plot of an output 16-QAM (Quadrature Amplitude Modulation) signal over flat Rayleigh plus AWGN channel without Doppler at EbN0=12 dB. The Rayleigh fading amplitude a has the following the probability density function (pdf) [6], $$p(\alpha) = \frac{2\alpha}{\Omega} e\left(-\frac{\alpha^2}{\Omega}\right) \alpha > 0 \tag{28}$$

Where, $\Omega = E(\alpha^2)$ is the average fading power

Figure 4:
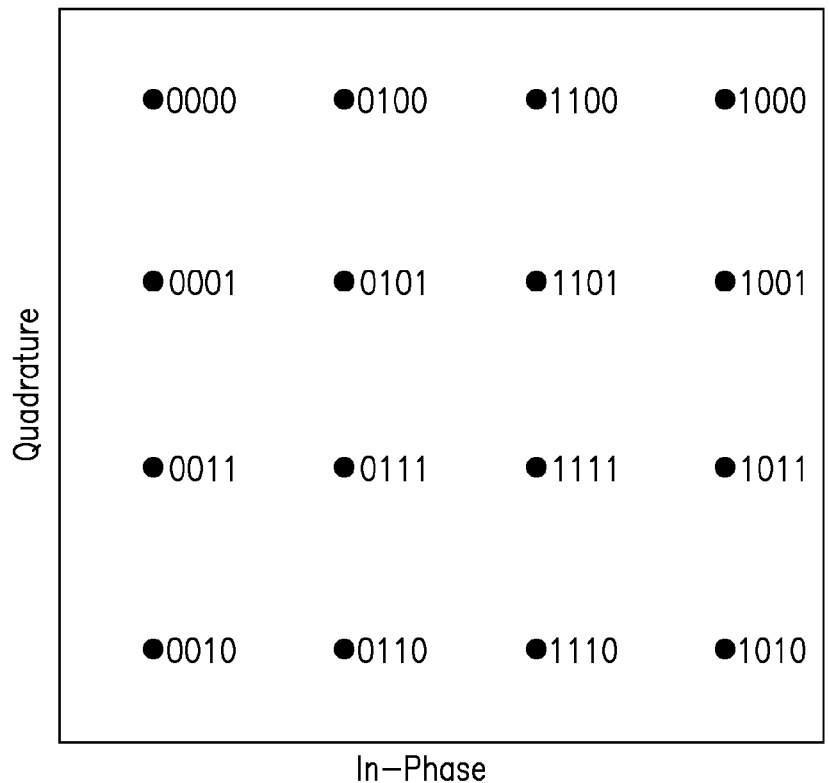
FIG. 4 illustrates complex modulation with gray coded symbols for 16 QAM modulation.

As previously described, FIG. 2 illustrates the block schematic diagram of the communications channels using Multi-Level Quadrature Amplitude Modulation (M-QAM) with KV encoding and decoding over flat slow Rayleigh fading plus AWGN channel. The coefficient samples of a set of KV blocks interleave over the channel to disperse the coefficient samples to minimize the impact of multi-path fading impairment and burst errors. The finite values real value coming out of each coefficient sample is coded in digital form for use on M-QAM. The coded samples are split into Inphase (I) and Quadrature (Q) for complex modulation using Gray coding as shown in FIG. 4. At the receiving side, the inverse operation is performed.

Also, there is a need to compensate for the amplitude and phase variations that are caused by the multi-path fading channel. It is accomplished prior to demodulation.

In order to derive the performance results to demonstrate the handling of multi-path fading and Doppler effects using KV transform coding over M-QAM communications channel, the system illustrated in FIG. 2 was implemented. The performance without KV transform and with KV transform was compared to handle the impairments of the channel.

Noting for square M-QAM, the symbol error probability is given by:

$$P_s = 4\frac{\sqrt{M}-1}{\sqrt{M}} Q\left(\sqrt{\frac{3}{M-1}\frac{kE_b}{N_0}}\right) - 4\left(\frac{\sqrt{M}-1}{\sqrt{M}}\right)^2 Q^2\left(\sqrt{\frac{3}{M-1}\frac{kE_b}{N_0}}\right) \tag{29}$$

where, $E_b$ is the bit energy and $N_0$ is the one-sided noise power spectral density of AWGN The Bit Error Rate (BER) probability is given by:

$$P_b \cong 4\frac{\sqrt{M}-1}{\sqrt{M}} \sum_{i=0}^{\frac{\sqrt{M}}{2}-1} Q\left((2i+1)\sqrt{\frac{3E_b k}{N_0(M-1)}}\right) \tag{30}$$

As fading channel produces a random amplitude, the average symbol probability is considered as a BER again for square M-QAM (9) is given by:

$k=\log_2 M$ and the probability of symbol error, $P_s$ is given by [9]:

$$P_s = 2\left(\frac{\sqrt{M}-1}{\sqrt{M}}\right)\left(1 - \sqrt{\frac{1.5k\Omega E_b/N_0}{M-1+1.5k\Omega E_b/N_0}}\right) - \left(\frac{\sqrt{M}-1}{\sqrt{M}}\right)^2\left[1 - \sqrt{\frac{1.5k\Omega E_b/N_0}{M-1+1.5k\Omega E_b/N_0}}\left(\frac{4}{\pi}\tan^{-1}\sqrt{\frac{1.5k\Omega E_b/N_0}{M-1+1.5k\Omega E_b/N_0}}\right)\right] \tag{31}$$

The corresponding probability of bit error, $P_b$ is given by (9):

$$P_b = 4\left(\frac{\sqrt{M}-1}{k\pi\sqrt{M}}\right)\sum_{i=1}^{\frac{\sqrt{M}}{2}} \int_0^{\pi/2} M_\gamma\left(-\frac{(2i-1)^2 3k\frac{E_b}{N_0}}{2\sin^2\theta(M-1)}\right) d\theta \tag{32}$$

Where, $M_\gamma(s)$ is the Moment Generating Function (MGF) of the instantaneous fading power.

Therefore, for the Rayleigh fading channel, the BER probability, $P_b$ becomes (9):

$$P_b \cong 2\left(\frac{\sqrt{M}-1}{k\sqrt{M}}\right)\sum_{i=1}^{\frac{\sqrt{M}}{2}}\left(1 - \sqrt{\frac{1.5(2i-1)^2 k\Omega \frac{E_b}{N_0}}{M-1+1.5(2i-1)^2 k\Omega \frac{E_b}{N_0}}}\right) \tag{33}$$

Since, KV transform corrects one out of four samples we can derive the KV block error probability with/without single sample error correction as follows:

Assuming n is the number of samples in one KV block, we can specify the KV block error probability without single sample error correction, KV Block Error Probability without single sample error correction:

$$p_{blk} = 1 - (1-p_s)^n \tag{34}$$

KV Block Error Probability without single sample error correction:

$$p_{blk}^c = 1 - \sum_{i=0}^{1} p_s^i (1-p_s)^{n-i} \tag{35}$$

This will lead us to determine the average number of samples in error per KV Block and the average sample error probability.

The average number of samples in error per KV block with single sample error correction, $\overline{N}_s^c$:

$$\overline{N}_s^c = \sum_{i=2}^{n} i \binom{n}{i} p_s^i (1-p_s)^{n-i} \qquad (36)$$

Then the average sample error probability with single sample error correction, $\overline{p}_s^c$ is:

$$\overline{p}_s^c = \frac{1}{n} \overline{N}_s^c \qquad (37)$$

The Bit error probability with single sample error correction, $\overline{p}_b^c$ can be approximated as:

$$\overline{p}_b^c \cong \frac{\overline{p}_s^c}{\log_2 M} = \frac{\overline{N}_s^c}{n \log_2 M} \qquad (38)$$

Also, the average bit error probability is bounded by:

$$\frac{\overline{p}_s^c}{\log_2 M} \leq \overline{p}_b^c \leq \overline{p}_s^c \qquad (39)$$

Figure 5:
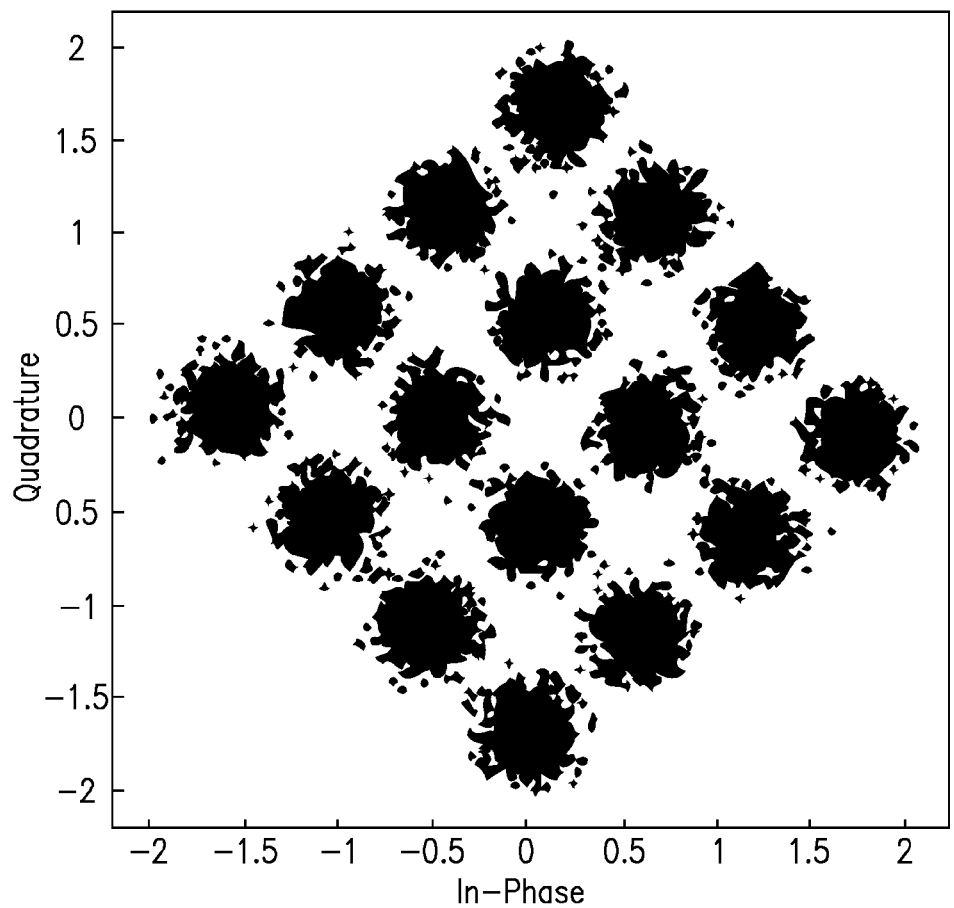
FIG. 5 illustrates a scatter plot of an output of a 16QAM signal over flat Rayleigh fading plus AWGN channel.
Figure 6:
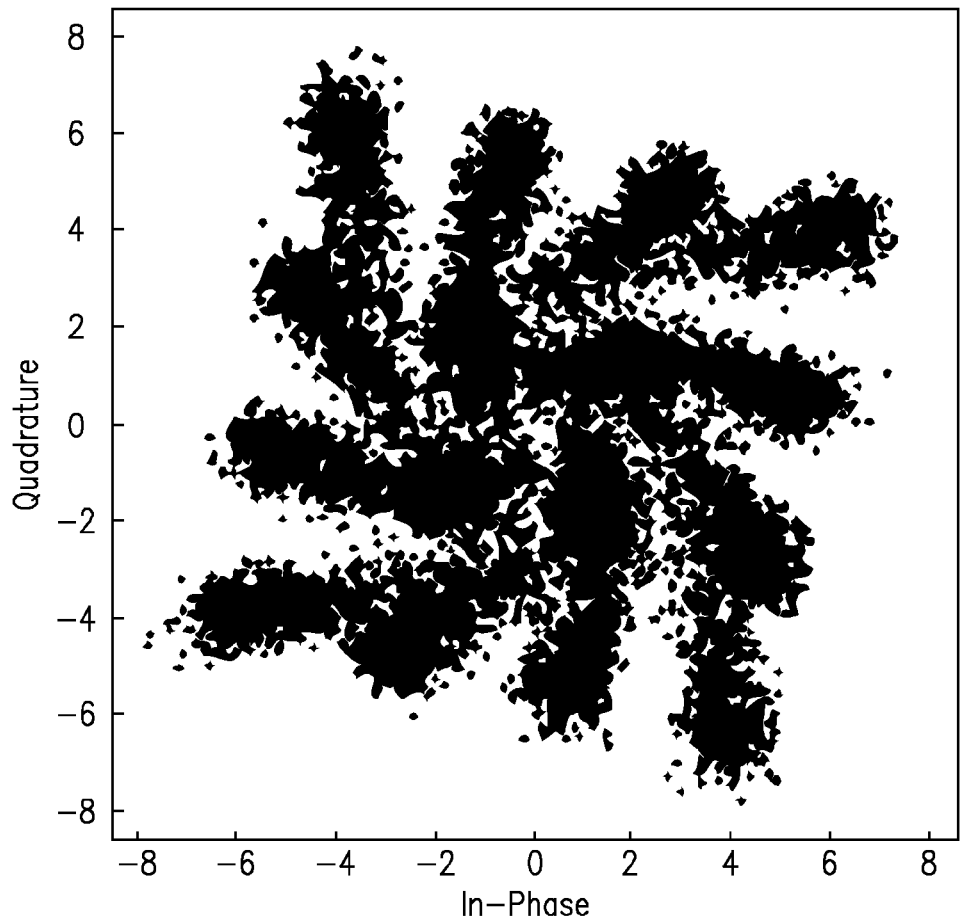
FIG. 6 illustrates a scatter plot of an output of a 16 QAM signal over flat Rayleigh fading plus AWGN plus Doppler at 50 HZ, FIG. 7 Is similar to FIG. 5, but without Doppler, FIG. 8 compares a theoretical system with the inventive system.

FIGS. 5 and 6 illustrate the scattered plots of the output of 16-QAM signal over flat Rayleigh fading plus AWGN channel with no Doppler in FIG. 5 and with Doppler in FIG. 6. In both cases, there is no amplitude and phase compensation. The $$\frac{E_b}{N_0}$$

is set to 12 dB in both cases.

Figure 7:
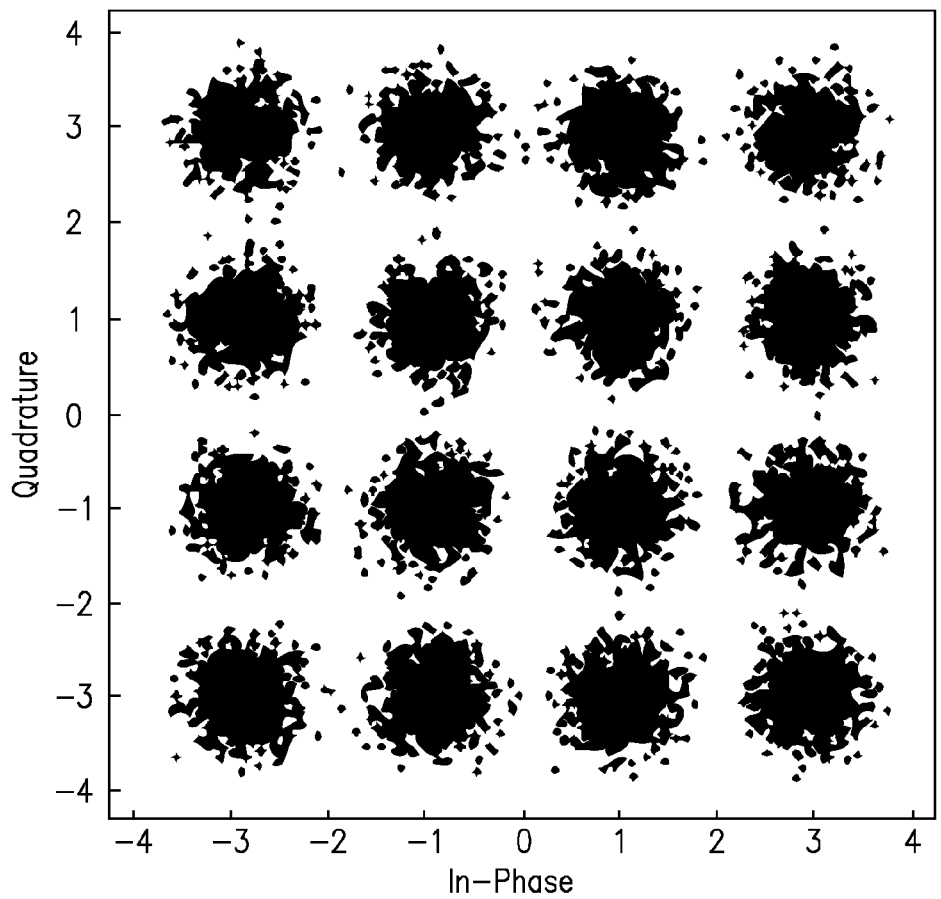

FIG. 7 shows the scattered plot of 16-QAM over Raleigh Fading+AWGN with amplitude and phase compensation at $E_b/N_0$=12 dB.

The system was emulated using MATLAB code and the error mitigations were created for various conditions. It is important to note the performance improvement of the system due to KV transformation, Sample interleaving, Amplitude and Phase compensation when multi-path fading and Doppler effects (FIG. 9) are introduced with an AWGN channel reaches close to that of the system when it only experiences the effects of AWGN (FIG. 8).

Figure 8:
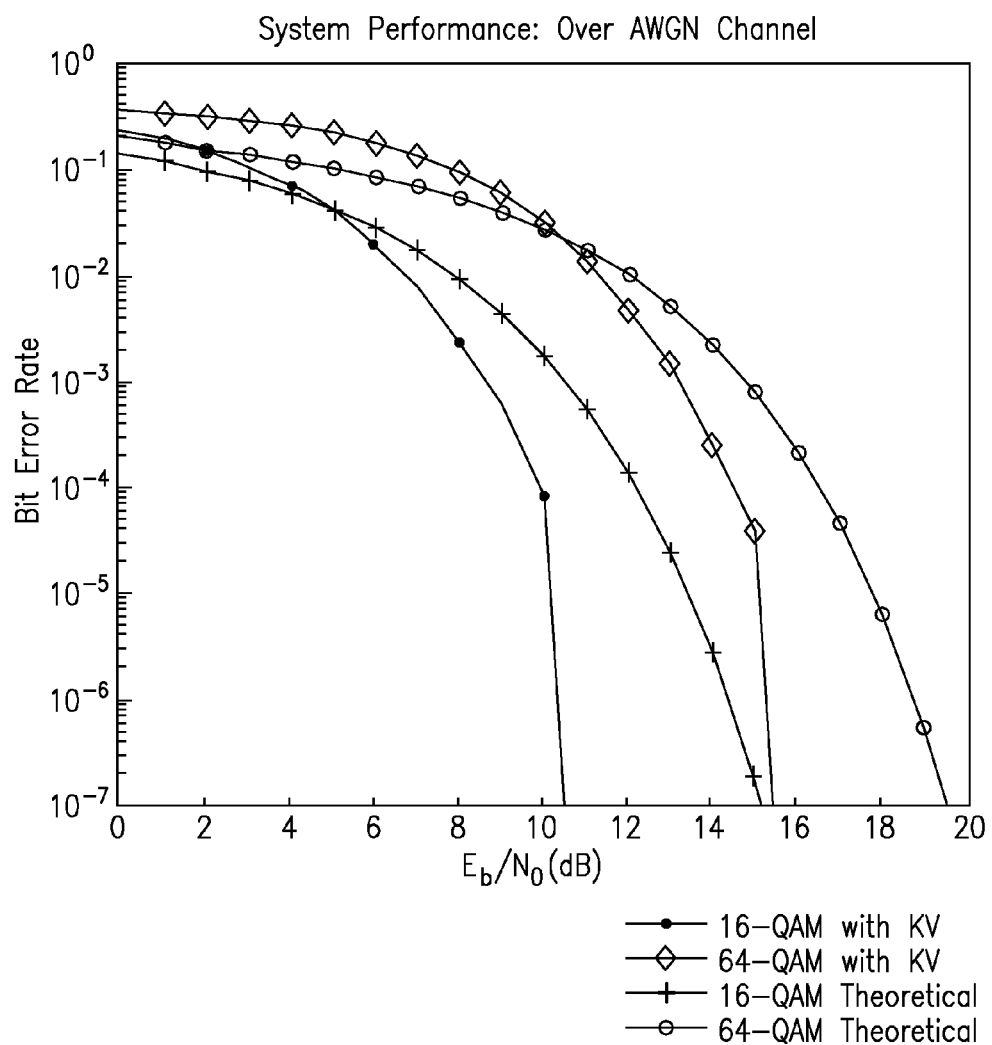

FIG. 8 shows the performance comparison of the theoretical M-QAM communications channel with and without KV transform coding. We can see that the performance of 16-QAM with KV surpasses the system without KV coding after Eb=N0=5 dB, and for 64-QAM it happens after Eb=N0=11 dB. Also the bit error probability descends much faster than that of the system without implementing KV transform coding. An additional significant phenomenon is that after Eb=N0=10 dB and Eb=N0=15 dB for 16-QAM and 64-QAM respectively, the bit error probability system with KV transform coding drops saying much less than $10^{-7}$. If we take look at the two curves, 64-QAM with KV and theoretical 16-QAM, this imposes us that when there is able to obtain an EbN0 above 15 dB, the system could use 64-QAM not 16-QAM to communicate without increasing the bit error probability even achieving better performance. However, we need point out that if the EbN0 is less than 5 dB and 11 dB for 16-QAM and 64-QAM respectively, the bit error probability with using KV coding is a little higher than the corresponding theoretical MQAM. This is because as mentioned in previous section, KV transform coding is able to correct one out of four sample error. At lower EbN0, there mostly have more than one sample errors.

In FIG. 9 we compare the performance over slow flat Rayleigh fading plus AWGN Channel between the theoretical QAM modulation without KV transform coding and corresponding cases with KV transform coding. In this implementation, we introduce the sample interleaving and de-interleaving, as shown in FIG. 9, to mitigate the impacts by the burst errors, which can be caused by channel deep fading, sudden motion of obstacles along the transmission, electronic issues, and etc. These burst errors can cause some transmitted package blocks to be lost. As we can see the two curves in FIG. 8, one for 16-QAM and the other for 64-QAM with KV but without interleaving (IL) are going to be flat (approximately constant) after some values of Eb/N0 even KV coding is implemented. This is caused by the burst errors, since we are not able to improve the system bit error probability by just increasing the values of Eb/N0. The other two curves, 16-QAM and 64-QAM with KV and inter-leaving demonstrate that interleaving significantly improves the system performance. The same phenomenon appears for the case when Eb/N0 is over 12 dB and 16 dB for 16-QAM and 64-QAM respectively, the system bit error probability drops to a much lower level than $10^{-7}$.

In more recent wireless evolution, the use of Multiple Input Multiple Output (MIMO) technology has provided advantages in the overall data throughput. However, it is important to note that the receiving diversity where multiple receiving antennas are employed with Maximum Ratio Combining (MRC) is a crucial aspect. For MRC diversity combining, a perfect knowledge of the branch amplitudes and phases are required. MRC diversity combining provides an optimal diversity such that it offers the maximal capacity improvement. The exact expressions of symbol error rate of linearly modulated signals over a generalized multilink fading channel are known to have been extensively studied and previously derived.

$$p_s^L = \frac{4}{\pi}\left(1 - \frac{1}{\sqrt{M}}\right)\int_0^{\frac{\pi}{2}} \prod_{l=1}^{L} M_{\gamma l}\left(-\frac{3/(2(M-1))}{\sin^2\theta}\right)d\theta - \qquad (40)$$

$$\frac{4}{\pi}\left(1 - \frac{1}{\sqrt{M}}\right)^2 \int_0^{\frac{\pi}{4}} \prod_{l=1}^{L} M_{\gamma l}\left(-\frac{3/(2(M-1))}{\sin^2\theta}\right)d\theta$$

Where, $$M_{\gamma l} \cong \int_0^{\infty} p_{\gamma l}(\gamma l) e^{s\gamma k}$$

k=$\log_2 M$ is the Moment Generating Function (MGF) of SNR per symbol γl associated with path l and L is the order of receiving diversity.

By substituting $p_s^L$ in to equations 35-37, it is possible to compute the associated block error probability, average sample error probability with/without single sample error correction respectively. The performance plots for different M-QAM channels are shown below using MATLAB function 'berfading'.

Figure 10:
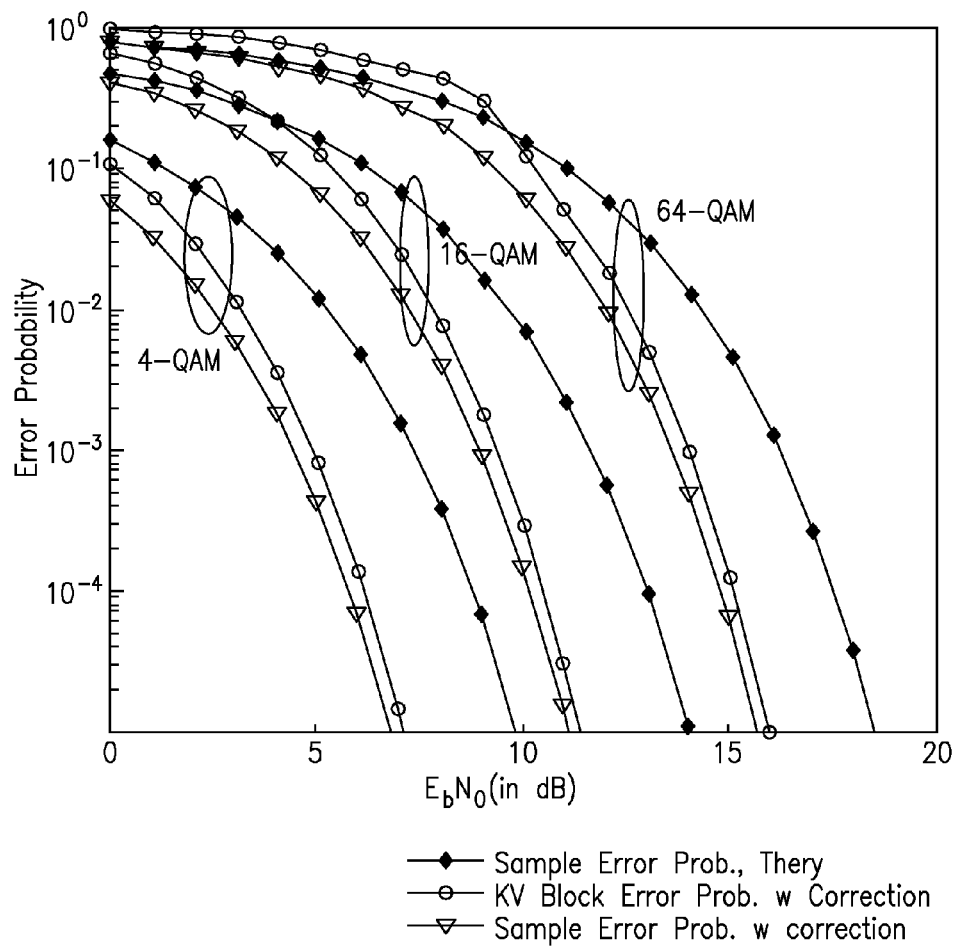
FIG. 10 illustrates a first block error probability plot in accordance with the present invention.

FIG. 10 illustrates the KV Block Error Probability with single sample error correction and sample error probability assuming that each KV block has four samples and one out of four is corrected (only AWGN). The KV Block is declared in error after error correction if and only if more than two samples are in error out of four samples.

Figure 11:
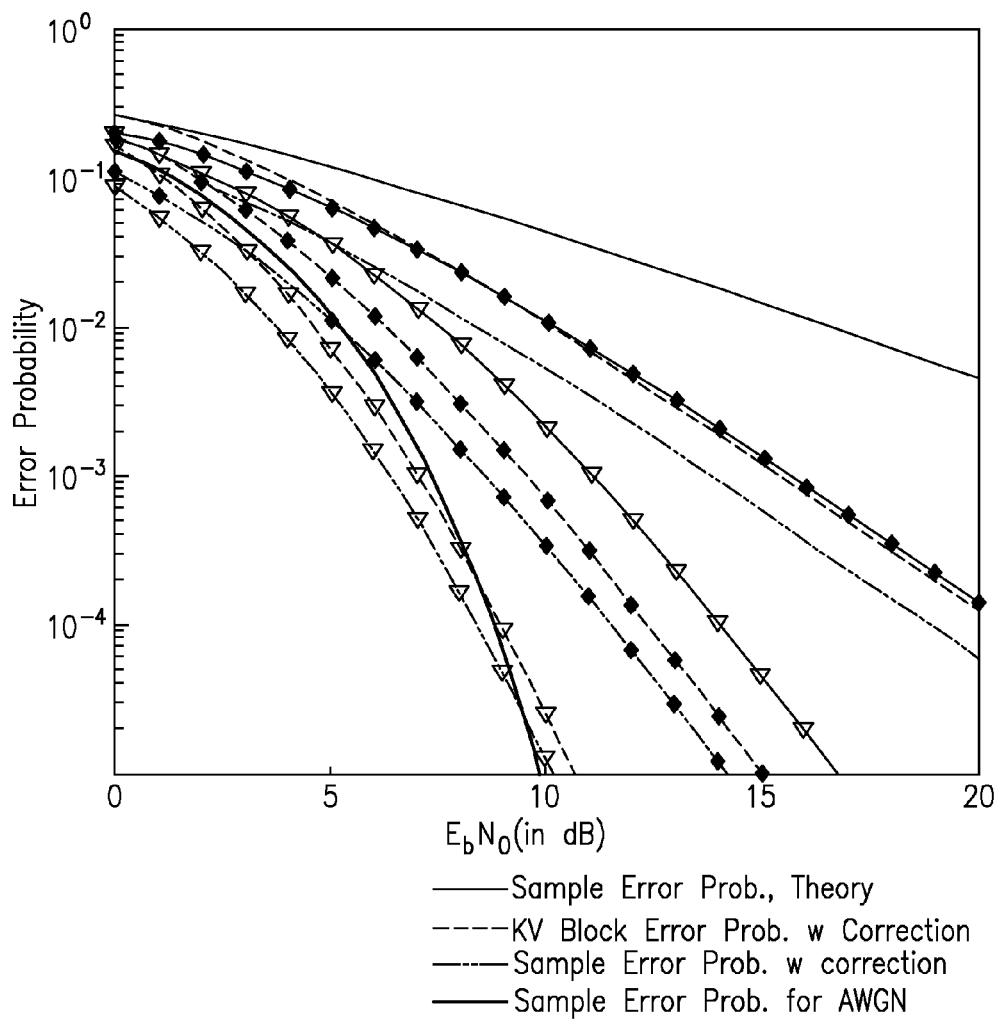
FIG. 11 illustrates a second block error probability plot in accordance with the present invention.

From FIG. 11, we can see that for the case of L=2 and with using KV coding scheme to correct single sample in error, the sample error rate is better than the scenario that for L=4 without implementing KV transform coding. This is a great phenomenon for devices with limited volume, where it is pretty difficult to implement more than two receiving antennas. However, by using KV transform coding, we could achieve a significant performance improvement.

Figure 12:
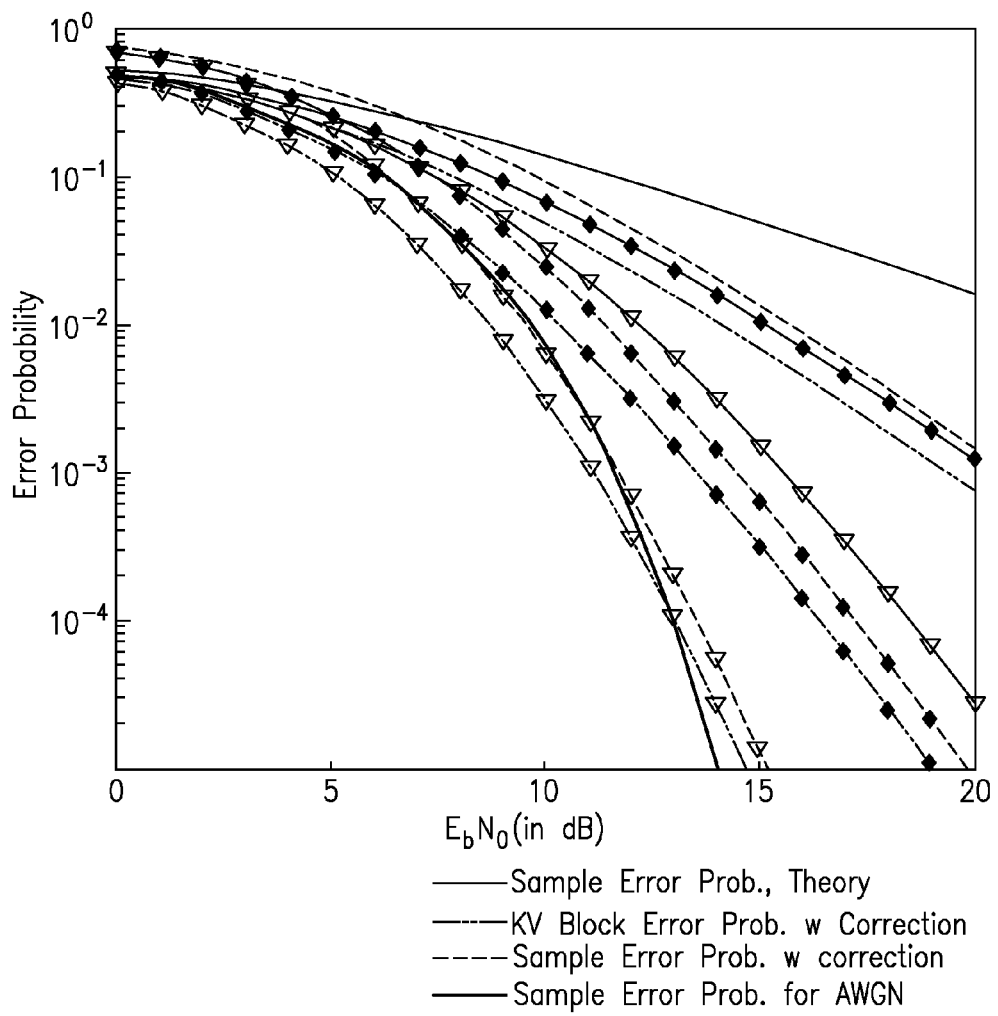
FIG. 12 illustrates a third block error probability plot in accordance with the present invention.
Figure 13:
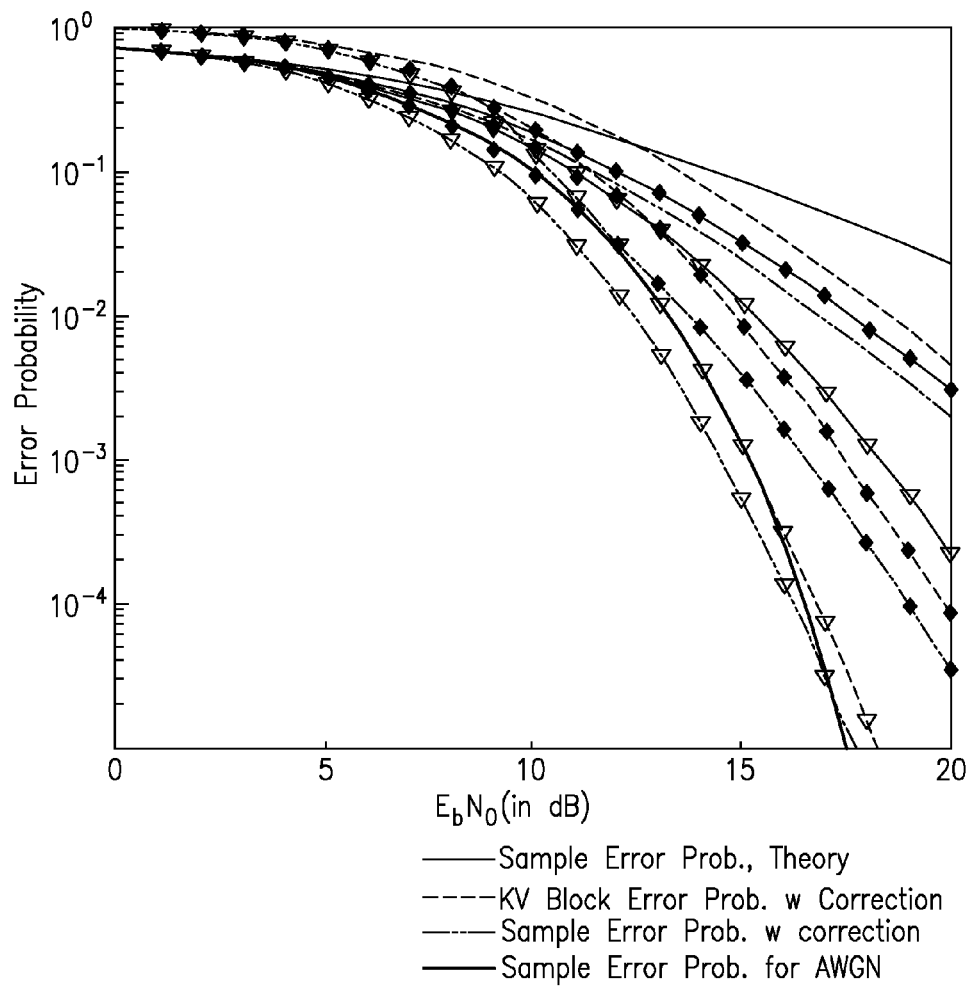
FIG. 13 illustrates a fourth block error probability plot in accordance with the present invention.

Similar improvements are achieved in other cases of 16-QAM and 64-QAM. FIG. 12 shows the performance of 16-QAM, and FIG. 13 shows the performance for 64-QAM. In these figures, we also show the average sample error probability without using KV coding over AWGN channel.

The proposed inventive method and apparatus has been extensively studied to demonstrate the improved BER performance when multi-path fading and Doppler effects are presented in wireless channels. The multi-path fading based on Rayleigh fading, Doppler effect and burst errors are modeled to characterize the indoor situational system. The wireless channel is considered using multi-level QAM (M-QAM) modulation. The overall system is implemented using integrated KV transform coding and M-QAM modulation to demonstrate significant improved performance. With KV, phase equalization and sample interleaving, the performance of QAM channel is significantly improved to achieve BER of less than $10^{-7}$ at $E_b/N_0$ of 10 dB (16 QAM) and 15.5 dB (64 QAM) over AWGN channel and at $E_b/N_0$ of 12 dB (16 QAM) and 16.5 dB (64 QAM) over Rayleigh Faded channel with slow Doppler.

In addition, we demonstrated the system performance of combined KV transform coding and maximal ratio combining (MRC) technique at the receiving side. The results illustrate that with two receiving antennas, the performance over Rayleigh fading channel with Doppler effects reaches close to that of AWGN channel and with four receiving antennas, the system performance over Rayleigh fading channel with Doppler effects converges close to that of the AWGN channel. This improvement in performance of KV/QAM system with multiple antennas on receiving side is extremely significant for handling multi-path fading and reliable transmission can be achieved. Using two antennas over a radio is more reasonable compared to using four antennas from a mechanical specification of the radio.

In summary, the performance results show that the overall system can be applied to any indoor situational awareness system where time critical applications such as video conferencing and fast response remote video delivery and real time tracking of mobile nodes. Moreover, the ability of KV transform to allow dynamic change of number of bits per sample without affecting the processing time (or end-to-end response time) is very critical for multi-service provisioning with Quality of Service assurance. The property of dynamically changing the number of bits per input sample is very effective in maintaining a target BER based on the real time channel condition which can be identified by the ratio of "number of KV blocks in error" and "number of blocks transmitted" in an ensemble, thus achieving assured end-to-end QoS for applications.

In summary, the proposed invention is applicable to all wireless infrastructures of WiFi, WiMAX, Generations of Cellular including 4G with/without MIMO technology to operate in multi-path fading and Doppler environment with delivery of QoS assured multi-service provisioning.

The description of certain embodiments of this invention is intended to be illustrative and not limiting. Other embodiments will be apparent to those skilled in the art, all of which are included within the broad scope of the invention. It is understood that the claims set forth herein cover all such alternative embodiments of the present invention.

The invention claimed is:

1. An error correction method for use in a digital communications system comprising:
    grouping incoming message bits from a message source into a plurality of groups, each group containing N bits, wherein said N bits range from 2-5;
    creating discrete analog samples from each group of N bits;
    transforming each of the analog samples into coefficient samples with a real 4-square ortho-normal matrix to create ortho-normal real value samples;
    generating additional coefficient samples using $d_1 = C_1 - C_2 + C_3 - C_4$ and $d_2 = C_1 + C_2 - C_3 - C_4$ and transmitting the ortho-normal real value samples and the additional coefficient samples over the digital communications system;
    receiving the ortho-normal samples and the additional coefficient samples at the receiver;
    applying the additional coefficient samples with a set of error policies on said ortho-normal real value samples to correct an error in any of the ortho-normal real value samples;
    processing the corrected ortho-normal real value samples by an invertible ortho-normal transform producing estimated discrete samples by transforming the corrected ortho-normal samples; and
    decoding the estimated discrete samples to provide received message bits which match the incoming message bits.

2. An error correction method for use in a wireless network, comprising:
    converting incoming information into N discrete samples, wherein said N range from 2-5;
    transforming each of the discrete samples into N coefficient samples having finite set of real values in coefficient samples using $$C_{ij} = M * b^T$$

$$[c_{i1} \ c_{i2} \ c_{i3} \ c_{i4}] = \begin{bmatrix} \frac{1}{\sqrt{2}} & \frac{1}{\sqrt{2}} & 0 & 0 \\ 0 & 0 & \frac{1}{\sqrt{2}} & \frac{1}{\sqrt{2}} \\ \frac{1}{\sqrt{2}} & \frac{1}{\sqrt{2}} & 0 & 0 \\ 0 & 0 & \frac{1}{\sqrt{2}} & \frac{1}{\sqrt{2}} \end{bmatrix} \cdot [b_{i1} \ b_{i2} \ b_{i3} \ b_{i4}]^T;$$

interleaving the N coefficient samples;
   encoding each said finite set of real value as a discrete constellation and transmitting the encoded information over the wireless network;
   receiving the encoded information at the receiver;
   providing phase and amplitude compensation, demodulation and de-interleaving for the encoded information at a receive side of the wireless network;
   decoding the encoded information and error correcting the decoded information; and mapping the decoded information to provide output information that matches the incoming information.

3. An error correction method for use in a digital communications system comprising:

grouping incoming message bits from a message source into a plurality of groups;

creating discrete analog samples from each group;

transforming each of the analog samples into coefficient samples with a real 4-square ortho-normal matrix to create ortho-normal samples;

generating additional coefficient samples using $d_1=C_1-C_2+C_3-C_4$ and $d_2=C_1+C_2-C_3-C_4$ and transmitting the ortho-normal samples and the additional coefficient samples over the digital communications system;

receiving the ortho-normal samples and the additional coefficient samples at the receiver;

applying the ortho-normal samples and the additional coefficient samples to an invertible ortho-normal transform to correct an error in any of the ortho-normal samples;

producing estimated discrete samples by transforming the corrected ortho-normal samples; and decoding the estimated discrete samples to provide received message bits which match the incoming message bits.

* * * * *

UNITED STATES PATENT AND TRADEMARK OFFICE
CERTIFICATE OF CORRECTION

PATENT NO. : 8,867,645 B2
APPLICATION NO. : 13/705817
DATED : October 21, 2014
INVENTOR(S) : Dhadesugoor Vaman and Siew T. Koay It is certified that error appears in the above-identified patent and that said Letters Patent is hereby corrected as shown below:

On the Title Page:

Item (72) Inventors: Dhadesugoor Vaman, Frederick, MD (US): Siew T. Koav, Houston, TX (US)

should read: Dhadesugoor Vaman, Frederick, MD (US): Siew T. Koay, Houston, TX (US)

Signed and Sealed this
Third Day of February, 2015

Michelle K. Lee
*Deputy Director of the United States Patent and Trademark Office*